United States Patent
Lin et al.

(10) Patent No.: US 10,961,617 B2
(45) Date of Patent: Mar. 30, 2021

(54) ARTICLES COATED WITH FLUORO-ANNEALED FILMS

(71) Applicant: Entegris, Inc., Billerica, MA (US)

(72) Inventors: I-Kuan Lin, Lexington, MA (US); Nilesh Gunda, North Chelmsford, MA (US); Dennis Radgowski, Brighton, MA (US); Chandra Venkatraman, Tyngsboro, MA (US)

(73) Assignee: ENTEGRIS, INC., Billerica, MA (US)

( * ) Notice: Subject to any disclaimer, the term of this patent is extended or adjusted under 35 U.S.C. 154(b) by 18 days.

(21) Appl. No.: 14/870,981

(22) Filed: Sep. 30, 2015

(65) Prior Publication Data

US 2016/0273095 A1  Sep. 22, 2016

Related U.S. Application Data

(60) Provisional application No. 62/208,532, filed on Aug. 21, 2015, provisional application No. 62/134,804, filed on Mar. 18, 2015.

(51) Int. Cl.
| | |
|---|---|
| *C23C 14/48* | (2006.01) |
| *C23C 14/58* | (2006.01) |
| *C23C 14/08* | (2006.01) |
| *H01J 37/32* | (2006.01) |

(52) U.S. Cl.
CPC ........... *C23C 14/48* (2013.01); *C23C 14/08* (2013.01); *C23C 14/083* (2013.01); *C23C 14/58* (2013.01); *C23C 14/5806* (2013.01); *C23C 14/5846* (2013.01); *H01J 37/32467* (2013.01); *H01J 37/32495* (2013.01)

(58) Field of Classification Search
CPC ................. C23C 14/48; C23C 14/58
USPC ........................................... 428/220
See application file for complete search history.

(56) References Cited

U.S. PATENT DOCUMENTS

| | | | |
|---|---|---|---|
| 4,950,558 A | * | 8/1990 | Sarin ............ C04B 41/52 428/212 |
| 6,387,509 B1 | | 5/2002 | Goto |
| 8,247,080 B2 | | 8/2012 | Iacovangelo et al. |
| 2002/0100909 A1 | | 8/2002 | Yamaguchi et al. |
| 2002/0125822 A1 | | 9/2002 | Graff et al. |

(Continued)

FOREIGN PATENT DOCUMENTS

| | | |
|---|---|---|
| JP | H07-153370 | 6/1995 |
| JP | 2006089338 A | 4/2006 |

(Continued)

OTHER PUBLICATIONS

Notification of Transmittal of the International Search Report and the Written Opinion of the International Searching Authority, of the Declaration for International Application No. PCT/US2012/050093, "AlON Coated Substrate with Optional Yttria Overlayer", dated Feb. 28, 2013.

(Continued)

*Primary Examiner* — Tahseen Khan
(74) *Attorney, Agent, or Firm* — Entegris, Inc.

(57) ABSTRACT

Articles and methods relating to coatings having superior plasma etch-resistance and which can prolong the life of RIE components are provided. An article has a vacuum compatible substrate and a protective film overlying at least a portion of the substrate. The film comprises a fluorinated metal oxide containing yttrium.

16 Claims, 17 Drawing Sheets

(56) References Cited

U.S. PATENT DOCUMENTS

| | | |
|---|---|---|
| 2003/0209710 A1 | 11/2003 | Yamazaki |
| 2004/0002221 A1 | 1/2004 | O'Donnell et al. |
| 2006/0115964 A1 | 6/2006 | Findikoglu et al. |
| 2009/0137101 A1 | 5/2009 | Yamazaki |
| 2010/0035036 A1* | 2/2010 | McCloy .................. C23C 14/06 428/220 |
| 2010/0089096 A1* | 4/2010 | Tamitsuji .................. C03C 3/06 65/30.13 |
| 2010/0129670 A1* | 5/2010 | Sun .................... H01J 37/32477 428/432 |
| 2010/0221905 A1 | 9/2010 | Hautala et al. |
| 2011/0133181 A1 | 6/2011 | Yamazaki |
| 2011/0135915 A1 | 6/2011 | Lee et al. |
| 2013/0284373 A1 | 10/2013 | Sun et al. |
| 2014/0099491 A1* | 4/2014 | Ameen ............... C23C 14/0021 428/220 |
| 2014/0178679 A1 | 6/2014 | Gunda |
| 2015/0096462 A1 | 4/2015 | Fukagawa et al. |

FOREIGN PATENT DOCUMENTS

| | | |
|---|---|---|
| JP | 2007290933 A | 11/2007 |
| JP | 2009-287058 | 12/2009 |
| JP | 2014-009361 | 1/2014 |
| JP | 2016-098143 | 5/2016 |
| KR | 10-2011-0118939 A | 11/2011 |
| TW | 436469 B | 5/2001 |
| WO | WO 2010/016973 | 6/2009 |
| WO | WO 2011/066314 | 6/2011 |
| WO | WO 2013/023029 | 2/2013 |
| WO | WO 2015/077601 | 5/2015 |
| WO | 2016/148739 A1 | 9/2016 |

OTHER PUBLICATIONS

Notification of Transmittal of International Preliminary Report on Patentability for International Application No. PCT/US2012/050093, "AlON Coated Substrate with Optional Yttria Overlayer", Date of Completion of Report: Jan. 3, 2014.

European Search Report issued in European Application No. 12822578.6 entitled "AlON Coated Substrate with Optional Yttria Overlayer", dated Mar. 2, 2015.

Notification of Transmittal of the International Search Report and the Written Opinion of the International Searching Authority, of the Declaration for International Application No. PCT/US2015/053260, "Articles Coated with Fluoro-Annealed Films", dated Feb. 2, 2016.

Harding, G. L., "High Rate D.C. Reactively Sputtered Metal-Oxy-Fluorine Dielectric Materials," Thin Solid Films vol. 138, pp. 279-287 (1986).

Wolborski, M. et al., "Improved Properties of AlON/4H-SiC Interface for Passivation Studies," Materials Science Forum vols. 600-603, pp. 763-766 (2008).

* cited by examiner

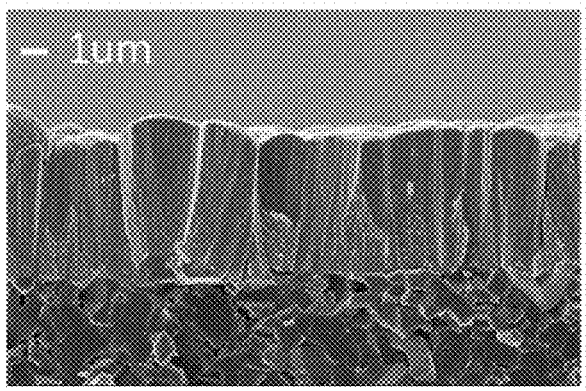
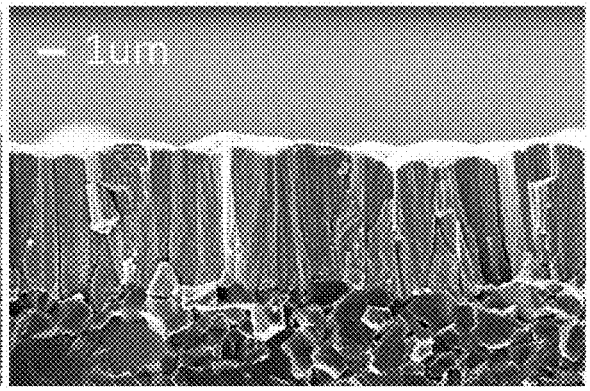
FIG. 5C　　　　　　　　　　　　　FIG. 5F
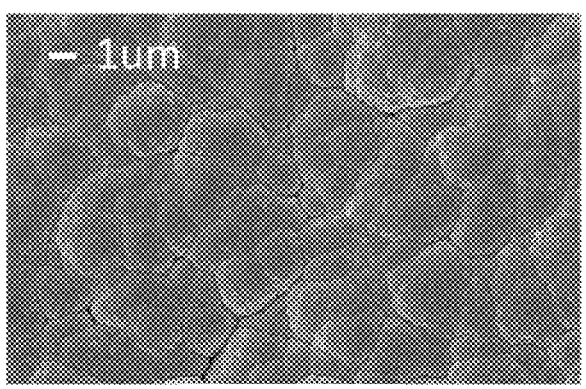
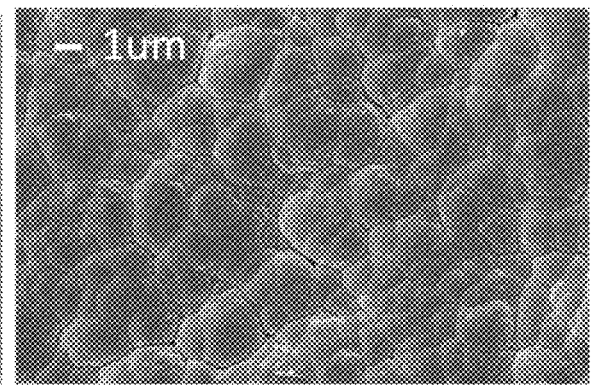
FIG. 5B　　　　　　　　　　　　　FIG. 5E
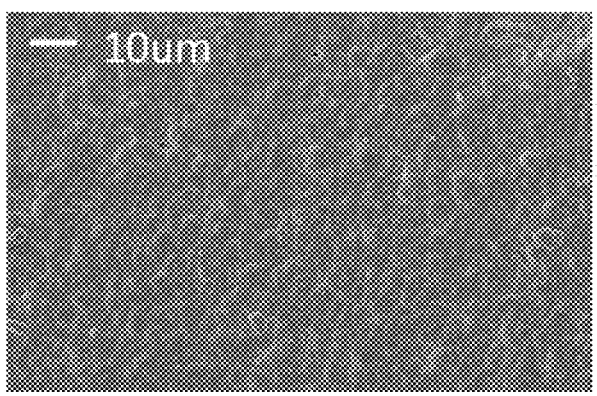
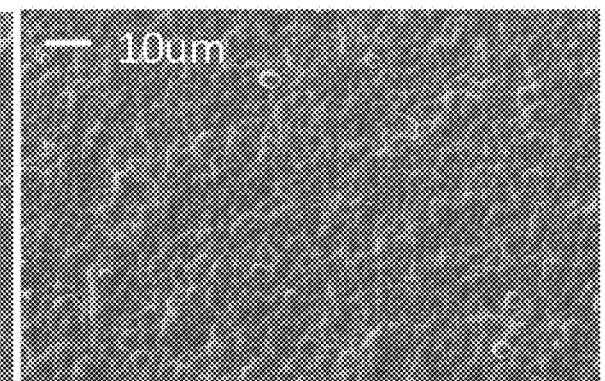
FIG. 5A　　　　　　　　　　　　　FIG. 5D

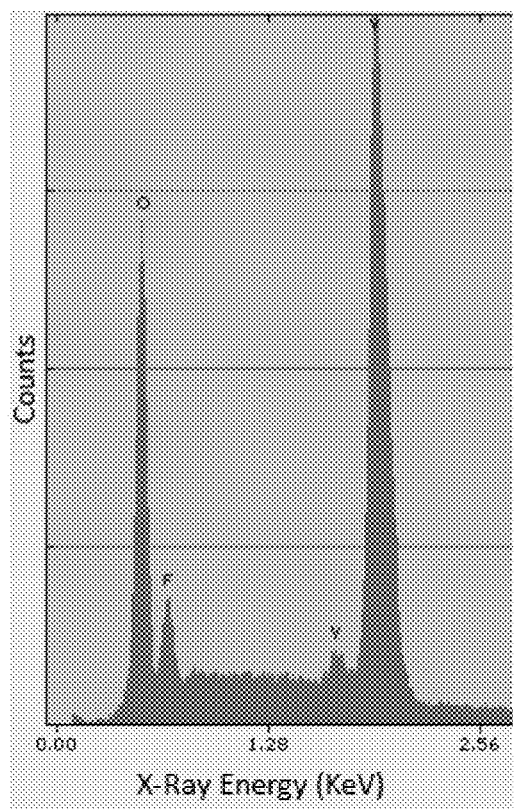
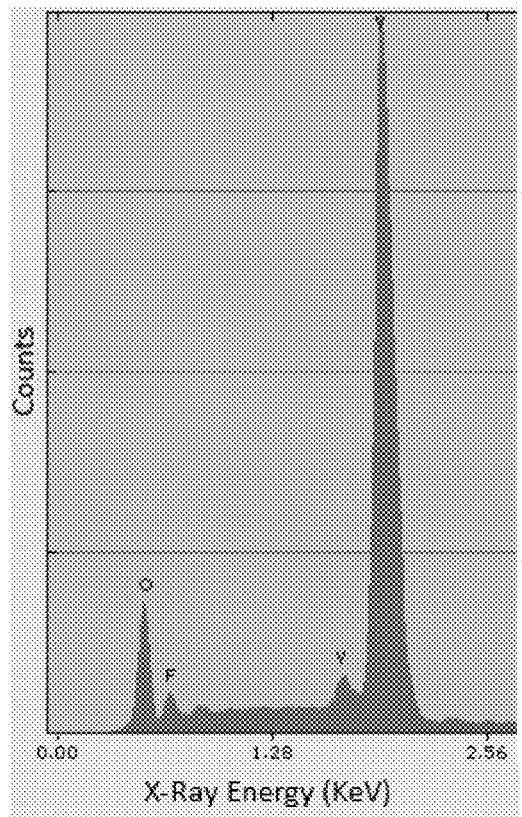
FIG. 8C
FIG. 8D

US 10,961,617 B2

ARTICLES COATED WITH FLUORO-ANNEALED FILMS

RELATED APPLICATIONS

This application claims the benefit of U.S. Provisional Application No. 62/134,804, filed on Mar. 18, 2015 and U.S. Provisional Application No. 62/208,532, filed on Aug. 21, 2015. The entire teachings of the above applications are incorporated herein by reference.

BACKGROUND OF THE INVENTION

Reactive-ion etching (RIE) is an etching technology used in semiconductor manufacturing processes. RIE uses chemically reactive plasma, which is generated by ionizing reactive gases (for example, gases that contain fluorine, chlorine, bromine, oxygen, or combinations thereof), to remove material deposited on wafers. However, the plasma not only attacks material deposited on wafers but also components installed inside the RIE chamber. Moreover, components used to deliver the reactive gases into the RIE chamber can also be corroded by reaction gases. The damage caused to components by plasma and/or reaction gases can result in low production yields, process instability, and contamination.

Semiconductor manufacturing etch chambers use components that are coated with chemically resistant materials to reduce degradation of the underlying component, to improve etch process consistency, and to reduce particle generation in the etch chambers. Despite being chemically resistant, the coatings can undergo degradation during cleaning and periodic maintenance where etchant gases combined with water or other solutions create corrosive conditions, for example hydrochloric acid, that degrade the coatings. The corrosive conditions can shorten the useful life of the coated component and may also lead to etch chamber contamination when the components are reinstalled in the chamber. There is a continuing need for improved coatings for etch chamber components.

SUMMARY OF THE INVENTION

Articles and methods relating to coatings having superior plasma etch-resistance and which can prolong the life of RIE components are provided.

In one version, an article comprises a vacuum compatible substrate and a protective film overlying at least a portion of the substrate. The film comprises a fluorinated metal oxide containing yttrium.

In another version an article comprises a vacuum compatible substrate and a protective film containing yttrium, oxygen, and fluorine. The film has a yttrium content of between 23 atomic percent and 38 atomic percent determined by Energy-dispersive X-ray spectroscopy (EDS), a fluorine content of between 4 atomic percent and 40 atomic percent, an oxygen content of between 59 atomic percent and 69.5 atomic percent. The film is pure yttrium oxyfluoride without yttrium fluoride content, and has rhombohedral or tetragonal structure as determined by X-ray powder diffraction (XRD). The film is stable in 5% aqueous hydrochloric acid after 5 minutes at room temperature.

The protective film can be fully fluorinated or partially fluorinated. The protective film can be yttrium oxyfluoride or fluorinated yttrium aluminum oxide. The film can also be a graded film, with the fluorine content of the film decreasing over a thickness of the film. For example, the film can have an outer portion that is yttrium oxyfluoride and an inner portion that is yttria, the fluorine content gradually decreasing from the outer portion to the inner portion. Alternatively, the film can have an outer portion that is fluorinated yttrium aluminum oxide (i.e., yttrium aluminum oxyfluoride) and an inner portion that is (unfluorinated) yttrium aluminum oxide.

The film can include rhombohedral or tetragonal $Y_aO_bF_c$, where $c/(a+b)=0.04 \sim 0.67$, and $Y_xO_y$, where $x/y=0.33 \sim 0.67$. Alternatively, the film can include $Y_eAl_fO_gF_h$, where $h/(e+f+g)=0.05 \sim 0.54$, and $Y_oAl_pO_q$, where $o/(p+q)=0.03 \sim 0.18$.

In a further version, an outer portion of the film from about 1 micron to about 2 microns thick is yttrium oxyfluoride and a remaining portion of the film is yttria. In another version, an outer portion of the film from about 1 micron to about 2 microns thick is yttrium aluminum oxyfluoride and a remaining portion of the film is yttrium aluminum oxide.

The film can be from about 1 micron to about 15 microns thick. The film can adhere to the substrate after 5 or more minutes when submerged in 5% aqueous hydrochloric acid at room temperature.

The vacuum compatible substrate can be quartz, alumina, aluminum, steel, metal, metal alloy, ceramic or plastics suitable for semiconductor manufacturing. The substrate can be a component in a semiconductor manufacturing system, for example, a chamber, chamber component, wafer susceptor, chuck, showerhead, liner, ring, nozzle, baffle, fastener, or wafer transport component.

In a further version, a method comprises providing a vacuum compatible substrate, depositing a metal oxide containing yttrium onto the substrate, and fluoro-annealing the film.

The fluoro-annealing can be performed at a temperature of about 300° C. to about 650° C. The fluorination process can be fluorine ion implantation followed by annealing, fluorine plasma processing at 300° C. or above, fluoropolymer combustion, fluorine gas reaction at an elevated temperature, UV treatment with fluorine gas, or any combination thereof.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 5A-5F are scanning electron microscope photographs of (A, B, C) as-deposited yttria film and (D, E, F) fluoro-annealed yttria film.

FIGS. 8A-8D are EDS analyses of (A, B) two fluoro-annealed samples prior to baking in a vacuum and (C, D) the two fluoro-annealed samples after baking in a vacuum.

DETAILED DESCRIPTION OF THE INVENTION

Figure 1:
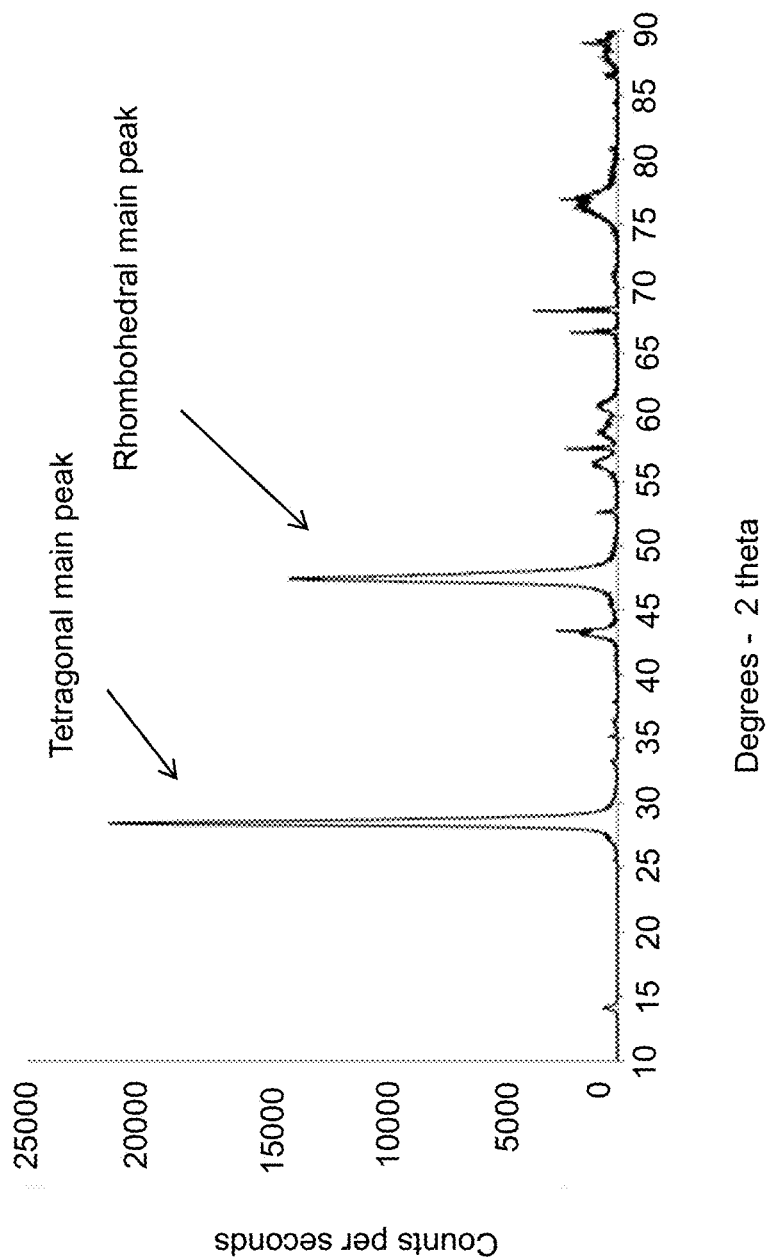
FIG. 1 is an x-ray diffraction (XRD) graph of a version of the present invention.

While this invention will be particularly shown and described with references to example embodiments thereof, it will be understood by those skilled in the art that various changes in form and details may be made therein without departing from the scope of the invention encompassed by the appended claims.

While various compositions and methods are described, it is to be understood that this invention is not limited to the particular molecules, compositions, designs, methodologies or protocols described, as these may vary. It is also to be understood that the terminology used in the description is for the purpose of describing the particular versions or versions only, and is not intended to limit the scope of the present invention which will be limited only by the appended claims.

It must also be noted that as used herein and in the appended claims, the singular forms "a", "an", and "the" include plural reference unless the context clearly dictates otherwise. Thus, for example, reference to a "film" is a reference to one or more films and equivalents thereof known to those skilled in the art, and so forth. Unless defined otherwise, all technical and scientific terms used herein have the same meanings as commonly understood by one of ordinary skill in the art. Methods and materials similar or equivalent to those described herein can be used in the practice or testing of versions of the present invention. All publications mentioned herein are incorporated by reference in their entirety. Nothing herein is to be construed as an admission that the invention is not entitled to antedate such disclosure by virtue of prior invention. "Optional" or "optionally" means that the subsequently described event or circumstance may or may not occur, and that the description includes instances where the event occurs and instances where it does not. All numeric values herein can be modified by the term "about," whether or not explicitly indicated. The term "about" generally refers to a range of numbers that one of skill in the art would consider equivalent to the recited value (i.e., having the same function or result). In some versions the term "about" refers to ±10% of the stated value, in other versions the term "about" refers to ±2% of the stated value. While compositions and methods are described in terms of "comprising" various components or steps (interpreted as meaning "including, but not limited to"), the compositions and methods can also "consist essentially of" or "consist of" the various components and steps, such terminology should be interpreted as defining essentially closed-member groups.

A description of example embodiments of the invention follows.

Coatings, including yttria (yttrium oxide), are used on RIE components to provide plasma etching resistance. Such coatings can be applied to RIE components by various methods, including thermal spray, aerosol, physical vapor deposition (PVD), chemical vapor deposition (CVD), and E-beam evaporation. However, yttria coatings can be corroded by hydrogen chloride (HCl) during maintenance of the RIE chamber and components. Following a chlorine plasma RIE process, residual chlorine remains on the RIE components. When the components are cleaned by deionized (DI) water during maintenance, the residual chlorine and DI water become HCl, which can corrode the yttria coating, preventing the yttria coating from protecting the underlying substrate during the next RIE process. Additionally, yttria coatings in an RIE chamber can particulate during the plasma etching process. The particles can fall on the silicon wafer, causing defects to the manufactured semiconductor device and causing losses to wafer production yields.

Versions of the present invention provide improved articles and methods for protecting RIE components by fluoro-annealing metal oxide yttrium-containing films, such as yttria and yttrium aluminum oxide.

The fluoro-annealing process includes introducing fluorine into metal oxide yttrium-containing films by annealing the films at 300° C.~650° C. in a fluorine containing atmosphere. The heating ramp rate of the fluoro-annealing process can be between from 50° C. per hour to 200° C. per hour.

Fluoro-annealed yttria films offer several advantages and have several desirable characteristics, including a high fluorine plasma etch resistance (e.g., about 0.1 to about 0.2 microns/hr), a high wet chemical etch resistance (e.g., about 5 to about 120 minutes in 5% HCl), good adhesion to chamber components (e.g., second critical load (LC2) adhesion of about 5N to about 15N), and conformal coating ability. Additionally, the fluoro-annealed yttria films are tunable in terms of material, mechanical properties, and microstructure. Films comprising yttria, fluoro-annealed yttria, or a mixture of both yttria and fluoro-annealed yttria can be created to meet the needs of a specific application or etching environment. For example, a fluorine content of a film can be manipulated to be from about 4 atomic percent to about 40 atomic percent, and a fluorine depth can be manipulated to be about 0.5 microns to about 20 microns. The etch resistance of fluorinated yttria increases with fluorine content in the film. Fluoro-annealed yttria films also offer the additional advantages of superior crack resistance and improved integrity at elevated temperatures versus non-fluorinated yttria films.

In one version of the invention, yttria ($Y_xO_y$) is deposited on a vacuum compatible substrate followed by a fluoro-annealing process to convert yttria to yttrium oxyfluoride ($Y_aO_bF_c$) or to a mixture of yttria and yttrium oxyfluoride. The yttria and/or yttrium oxyfluoride form a film overlying and protecting the substrate. The film provides an outermost layer that is in contact with the etching environment in the vacuum chamber. The material $Y_xO_y$ can have a composition where an x/y ratio is about 0.33 to about 0.67. The material $Y_aO_bF_c$ can have a composition where $c/(a+b)=0.04~0.67$.

A film of a metal oxide containing yttrium, such as yttria and yttrium aluminum oxide, is first deposited onto a vacuum compatible substrate. The deposition of the metal oxide film can occur by various methods, including thermal spray, sputtering, aerosol, physical vapor deposition (PVD), chemical vapor deposition (CVD), and E-beam evaporation. Following deposition, the film is fluoro-annealed at about 300° C. to about 650° C. in an environment containing fluorine. The fluorination process can be performed by several methods, including, for example, fluorine ion implantation followed by annealing, fluorine plasma processing at 300° C. or above, fluoropolymer combustion methods, fluorine gas reactions at elevated temperatures, and UV treatments with fluorine gas, or any combination of the foregoing.

Various sources of fluorine can be used depending upon the fluoro-annealing method employed. For fluoropolymer combustion methods, fluorine polymer material is needed and can be, for example, PVF (polyvinylfluoride), PVDF (polyvinylidene fluoride), PTFE (polytetrafluoroethylene), PCTFE (polychlorotrifluoroethylene), PFA, MFA (perfluoroalkoxy polymer), FEP (fluorinated ethylene-propylene), ETFE (polyethylenetetrafluoroethylene), ECTFE (polyethylenechlorotrifluoroethylene), FFPM/FFKM (Perfluorinated Elastomer [Perfluoroelastomer]), FPM/FKM (Fluorocarbon [Chlorotrifluoroethylenevinylidene fluoride]), PFPE (Perfluoropolyether), PFSA (Perfluorosulfonic acid), and Perfluoropolyoxetane.

For other fluoro-annealing methods, including fluorine ion implantation followed by annealing, fluorine plasma processing at 300° C. or above, fluorine gas reactions at elevated temperatures, and UV treatments with fluorine gas, fluorinated gases and oxygen gases are needed for reaction. Fluorinated gases can be, for example, hydrofluorocarbons (HFCs), perfluorocarbons (PFCs), sulfur hexafluoride ($SF_6$), HF vapor, NF3, and gas from fluoropolymer combustion.

The yttria or yttrium aluminum oxide film is preferably columnar in structure, such that the structure permits fluorine to penetrate the film through grain boundaries during the fluoro-annealing process. An amorphous yttria structure (i.e., non-columnar, or less-columnar) does not permit fluorine to penetrate as easily during the fluoro-annealing process.

Fluoro-annealed films of the present invention can be applied to vacuum compatible substrates, such as components in a semiconductor manufacturing system. Etch chamber components can include shower heads, shields, nozzles, and windows. The etch chamber components can also include stages for substrates, wafer handling fixtures, and chamber liners. The chamber components can be made from ceramic materials. Examples of ceramic materials include alumina, silicon carbide, and aluminum nitride. Although the specification refers to etch chamber components, versions of the invention are not limited to etch chamber components and other ceramic articles and substrates that would benefit from improved corrosion resistance can also be coated as described herein. Examples include ceramic wafer carriers and wafer holders, susceptors, spindles, chuck, rings, baffles, and fasteners. Vacuum compatible substrates can also be quartz, steel, metal, or metal alloy. Vacuum compatible substrates can also be or include plastics used for example in the semiconductor industry, such as polyether ether ketone (PEEK) and polyimides, for example in dry etching.

The fluoro-annealing films are tunable, with the fluoro-annealing process allowing for variations in depth and density of the fluorination of the films. In one version of the invention the fluoro-annealed film is completely fluorinated (fully saturated), with fluorine located throughout the depth of the film. In another version of the invention, the fluoro-annealed film is partially fluorinated, with fluorine located along an outer portion of the film but not throughout the entire depth of the film. In addition, the film can be a graded film, with the fluorine content varying over the depth of the film. For example, the top (outermost) portion of the film may include the highest fluorine content, with the fluorine content gradually decreasing over the depth the film toward the bottom (innermost) portion of the film that is closest to and interfaces with the substrate. The outermost portion of the film is that which faces the etching environment. In further versions a film can include a surface fluorine amount of about 42 atomic percent or less, in some cases 34 atomic percent or less, and in other cases 17 atomic percent or less; and, at a depth of about 6 microns, the fluorine content can be about 15 atomic percent or less, in some cases 6 atomic percent or less.

The depth of the fluorination of the film can be controlled during fluoro-annealing by varying process parameters. For example, for a yttria coating of 10 microns and a fluoro-annealing time of 2 hours at 400° C. in a fluorine-containing atmosphere will result in a fluorinated depth of approximately 1.5 microns. Fluoro-annealing yttria coatings at temperatures above about 300° C. can introduce fluorine into the film at depths greater than surface depths (i.e., greater than about 0.1 micron).

The film provides a protective layer overlying the substrate, the protective layer being an outermost layer of a coated article that is in contact with the environment inside the vacuum chamber.

In one version, the film is about 1 micron to about 15 microns thick. In a preferred version, the film is at least 3 microns thick. In further preferred versions, the films is at least 4 microns or 5 microns thick. In a particular version, the top 1-2 microns of the film is yttrium oxyfluoride, and a remaining depth of the film is yttria. In another version the top 1-2 microns of the film is yttrium aluminum oxyfluoride and a remaining depth of the film is yttrium aluminum oxide.

As described in Example 12, some metal oxides are not able to be fluorinated by fluoro-annealing. For such materials, a metal oxide that is capable of being fluorinated can be added to the composition. For example, aluminum oxide ($Al_rO_s$), where r/s=0.33~0.67, did not convert to aluminum oxyfluoride ($Al_rO_sF_t$) following fluoro-annealing. However, aluminum yttrium oxide ($Y_oAl_pO_q$), where o/(p+q)= 0.03~0.18, can convert to aluminum yttrium oxyfluoride ($Y_eAl_fO_gF_h$), where h/(e+f+g)=0.05~0.54, following fluoro-annealing. The addition of a "fluorinatable" metal oxide (in this case, yttrium) enabled the coating to be fluorinated by fluoro-annealing.

Accordingly, for films comprising other metal oxides (e.g. erbium oxide and cerium oxide), yttrium and/or yttria may be introduced into the material to ensure successful fluorination of the film by fluoro-annealing.

One version of the invention is an etch chamber component that has been coated with yttrium physical vapor deposited in an oxygen containing atmosphere. The coating is a ceramic material that includes yttrium and oxygen and can made using reactive sputtering or physical vapor deposition (PVD) techniques. The oxygen containing atmosphere during the PVD deposition can also include inert gases such as argon.

One version of the invention is a ceramic substrate that has been coated with yttria film deposited by reactive sputtering where the coating and the substrate are annealed in an oven containing a fluorine atmosphere at 300° C.~650° C. The fluoro-annealed coating is a ceramic material that includes yttrium, oxygen, and fluorine. The substrate and fluoro-annealed film can be baked at 150 degrees centigrade under high vacuum (5E-6 torr) without loss of fluorine from the coating.

The duration of time for annealing the yttria films at an elevated temperature can be from about 0.5 hours to about 3 hours or more. In some versions of the invention, the duration of time for annealing the yttria films at the elevated temperature can be from 1 hour to 2 hours. Various annealing temperatures are applied on yttria film made on an alumina ceramic substrate by reactive sputtering of yttrium in an oxygen containing atmosphere.

The crystal structure of yttria and fluoro-annealed yttria was measured by XRD. Versions of the invention are yttrium containing films that have a cubic yttria structure as determined by x-ray diffraction. Fluoro-annealed yttria films in versions of the invention have an x-ray diffraction pattern that matches the x-ray diffraction pattern of pure yttrium oxyfluoride. The fluoro-annealed films of the present invention can be made such that yttrium fluoride is not included in the film.

One version of the invention is a film that has a total thickness of 10 microns or less, where the top 2 microns or less of the film is the fluoro-annealed material.

Films of the present invention are typically a tan-color (i.e., they are not water-clear) and are not optically pure or optically transparent. Furthermore, as films increase in thickness, the films become less optically transparent.

In some versions of the fluoro-annealed yttria films, fluorine is present in the films as determined by EDS (energy dispersive spectroscopy). The amount of fluorine in the fluoro-annealed yttria films can range from 4 atomic percent to 31 atomic percent (see Example 7). In some versions, the atomic percent of fluorine varies throughout the thickness of the film with a higher atomic percent found in the top most surface of the film (i.e., the surface away from the underlying ceramic substrate).

The thickness of yttria or fluoro-annealed yttria films can be from 3 microns to 10 microns. Without limitation, coatings of yttria and fluoro-annealed yttria can be made with thicknesses of anywhere between 3 microns and 10 microns, (e.g., 2.1 microns, 4.5 microns, 7.3 microns, and the like).

Yttria films in versions of the invention can be made by reactive sputtering of yttrium onto a substrate in a reactive gas atmosphere. The reactive gas can be one that is a source of oxygen and can include for example air or oxygen.

The fluoro-annealing of yttria on a ceramic substrate, such as alumina, significantly improves the wet chemical (5% HCl) etch resistance of the yttria film.

The fluoro-annealed yttria film in versions of the invention can be characterized as those that adhere to an underlying ceramic substrate, the film adhering to the ceramic substrate after 5 or more minutes contact with 5% aqueous hydrochloric acid at room temperature. In some versions the fluoro-annealed yttria films adhere to the underlying ceramic substrate for between 15 minutes and 30 minutes, in some cases 30 minutes to 45 minutes, and in still other cases the films at adhere to the underlying substrate after 100-120 minutes when contacted or submerged in 5% aqueous HCl at room temperature. Yttria films in version of the invention can be used as protective coatings for components used in halogen gas containing plasma etchers. For example halogen containing gases can include $NF_3$, $F_2$, $Cl_2$ and the like.

Fluoro-annealed yttria films are particularly advantageous in fluorine based etching systems because the presence of fluorine in the film allows the chamber to stabilize or season more quickly. This helps to eliminate process drift during seasoning and use, and reduces etcher downtime for seasoning with a fluorine or chlorine containing gas.

EXAMPLE 1

Material Recognition with XRD of Fully-Fluorinated Film

FIG. 1 is an x-ray diffraction (XRD) graph of a fluoro-annealed film in accordance with a version of the present invention, specifically a completely-fluorinated film. X-ray diffraction measurements were obtained with Scintag PAD V hardware and DMSNT software using JCPDS standards. Peak positions in the XRD graph correspond to where an x-ray beam has been diffracted by a crystal lattice. A unique set of degree-spacings in an XRD graph can be used to identify and characterize crystalline materials.

Yttria was coated onto an alumina substrate followed by fluoro-annealing at 550° C. for 4 hours in a fluorine containing atmosphere. After the fluorination process, the yttria was confirmed to have been converted to pure yttrium oxyfluoride. The XRD pattern of fluoro-annealed yttria matches the pattern of yttrium oxyfluoride. The XRD patter has first and second strong peaks at 28.3961 (+/−0.5) and 47.2761 (+/−0.5) degrees of two theta, respectively. The XRD main peaks indicate yttrium oxyfluoride consists of tetragonal and rhombohedral crystal systems. The first and second strong peaks of yttrium fluoride, which are 27.8839 (+/−0.5) and 30.9600 (+/−0.5) degrees of two theta, are not detected in the XRD pattern, indicating that the fluoro-annealing process converted yttria to yttrium oxyfluoride only.

EXAMPLE 2

Material Recognition with XRD of Partially-Fluorinated Film

Figure 2:
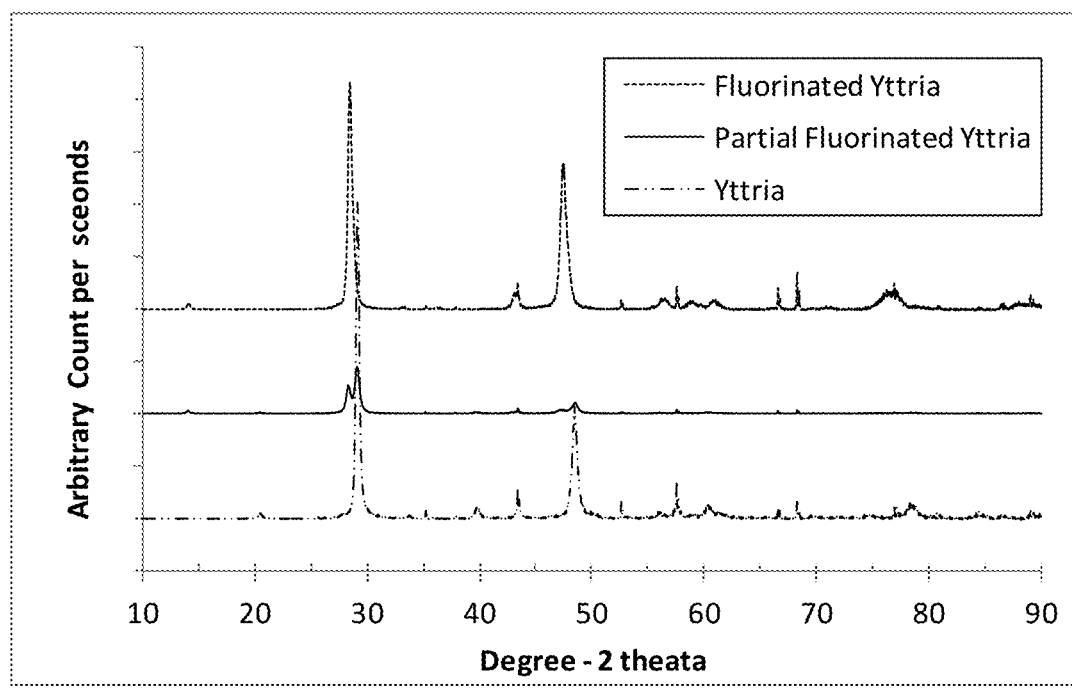
FIG. 2 is an XRD graph of another version of the present invention.

FIG. 2 is an x-ray diffraction (XRD) graph of a fluoro-annealed film in accordance with another version of the present invention, specifically a partially-fluorinated yttria film. The fluoro-annealing process was controlled to partially-fluorinate yttria by controlling the fluorine source amount, annealing temperature, and annealing time. The film was annealed at 400° C. for about 2 hours in a fluorine-containing atmosphere. In FIG. 2, the as-deposited yttria has first and second strong peaks at 28.7245 (+/−0.5) and 47.7501 (+/−0.5) degrees of two theta, respectively, in the XRD pattern, and its crystal system is cubic. The XRD pattern of partially-fluorinated yttria film is the combination of yttria and yttrium oxyfluoride XRD patterns, indicating that yttria and yttrium oxyfluoride co-exist in the film.

EXAMPLE 3

Material Recognition with XPS

Figure 3:
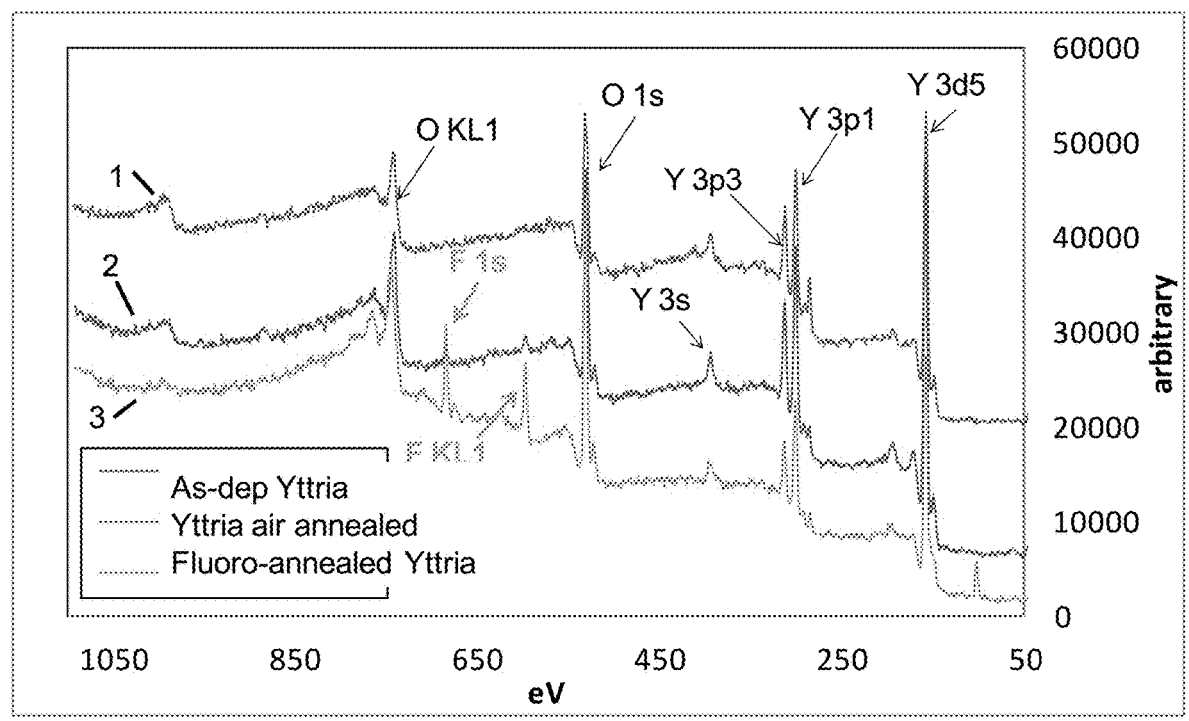
FIG. 3 is an x-ray photoelectron spectroscopy (XPS) graph of as-deposited Yttria, air-annealed yttria, and fluoro-annealed yttria.

FIG. 3 is an x-ray photoelectron spectroscopy (XPS) graph illustrating the spectra of as-deposited yttria (line 1), air-annealed yttria (line 2), and fluoro-annealed yttria (line 3). XPS spectra were obtained with Vacuum Generators Escalab MK II and Avantage software.

Yttria was deposited onto an alumina substrate, and its XPS spectrum was measured prior to annealing. The XPS spectrum of the as-deposited yttria is represented by line 1. The yttria was then air-annealed at 550° C. for approximately 2 hours and its XPS spectrum measured. The XPS spectrum of the air-annealed yttria is represented by line 2. A second sample of yttria deposited onto a substrate was fluoro-annealed at 550° C. for approximately 2 hours and its measured XPS spectrum is represented by line 3.

The XPS spectra of as-deposited yttria film and the air-annealed yttria film show strong oxygen (O) and yttrium (Y) peaks. The XPS spectrum of the fluoro-annealed yttria shows strong fluorine (F) peaks in addition to O and Y peaks.

The XPS spectra confirm that fluorine bonded to yttria, forming yttrium oxyfluoride ($Y_aO_bF_c$), in the fluoro-annealed sample.

EXAMPLE 4

Yttria Deposition

Yttria coatings were deposited by yttrium physical vapor deposition in an oxygen containing atmosphere (i.e., reactive sputtering) onto a ceramic substrate of alumina.

Figure 4A:
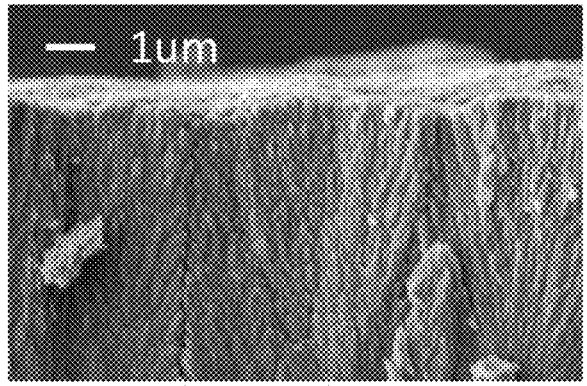
FIGS. 4A-4F are scanning electron microscope photographs of deposited coatings.
Figure 4B:
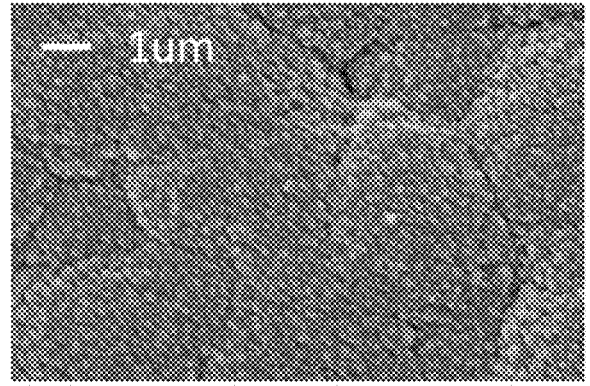
Figure 4C:
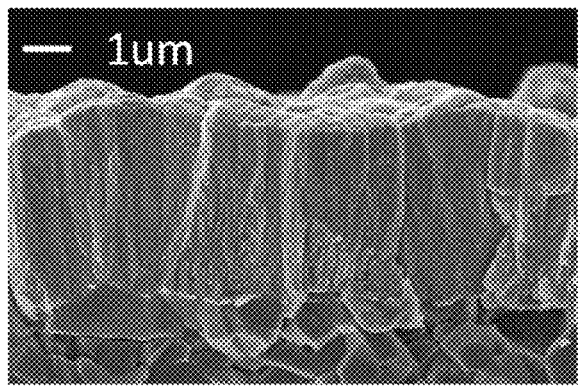
Figure 4D:
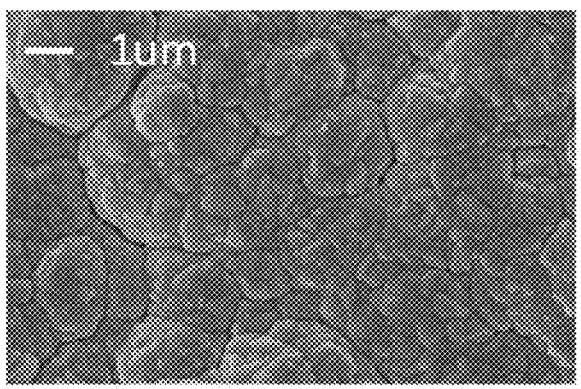
Figure 4E:
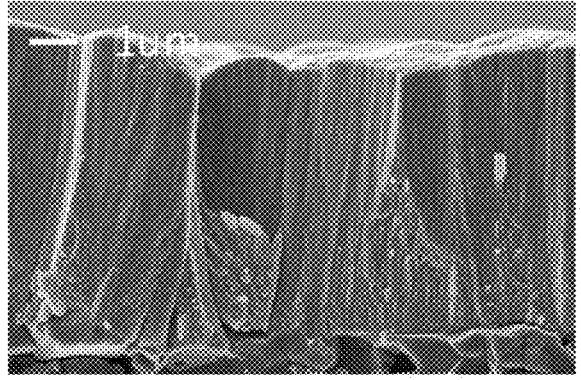
Figure 4F:
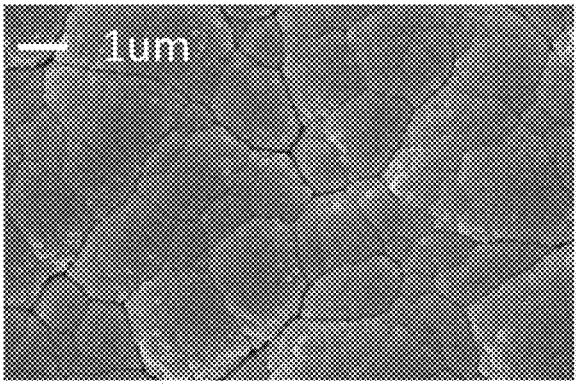

By varying the deposition process parameters, including power, voltage, pressure, and gas flow, various features of the yttrium film were manipulated, including the coating's microstructure, Young's modulus, hardness, residual stress, adhesion and composition. FIGS. 4A-4F show images obtained from a scanning electron microscope (AMRAY, Bedford, Mass.) of the deposited coatings, from more porous (FIGS. 4A and 4B) to more dense (FIGS. 4E and 4F).

From the tested samples, the following features were controlled within the indicated ranges:
Young's modulus: 100 GPa~200 GPa
Nanohardness: 3 GPa~15 GPa
Residual stress (on alumina substrate): −5 MPa~−200 MPa
Adhesion by scratch test (LC2): 5N~20N
$Y_xO_y$ composition: x/y=0.33~0.67
Microstructure: porous to dense, as shown in FIGS. 4A-4F

EXAMPLE 5

Fluoro-Annealing Compared to Air-Annealing

Two different annealing processes were applied to yttria film samples. The first annealing process involved air annealing, during which the samples were heated in an oven at 550° C. for 2 hours in air. The second annealing process involved fluoro-annealing, during which the samples were heated in an oven at 550° C. for 2 hours in a fluorine-containing atmosphere.

After both annealing processes, the color of the yttria coatings changed from dark tan to a light tan. The yttria coatings were not transparent or optically pure.

Fluoro-annealed films could be controlled to provide a $Y_aO_bF_c$ composition where c/(a+b)=0.04~0.67.

EXAMPLE 6

Coating Morphology

As-deposited yttria (prepared according to Example 4) and fluoro-annealed yttria films (prepared according to Example 5) were imaged with a scanning electron microscope (AMRAY, Bedford, Mass.). As-deposited yttria (made according the method described in Example 3) is shown in FIGS. 5A-5C. Fluoro-annealed yttria (made according to the method described in Example 4) is shown in FIGS. 5D-5F. The fluoro-annealing process did not change the morphology of the yttria films.

EXAMPLE 7

Composition

Figure 6A:
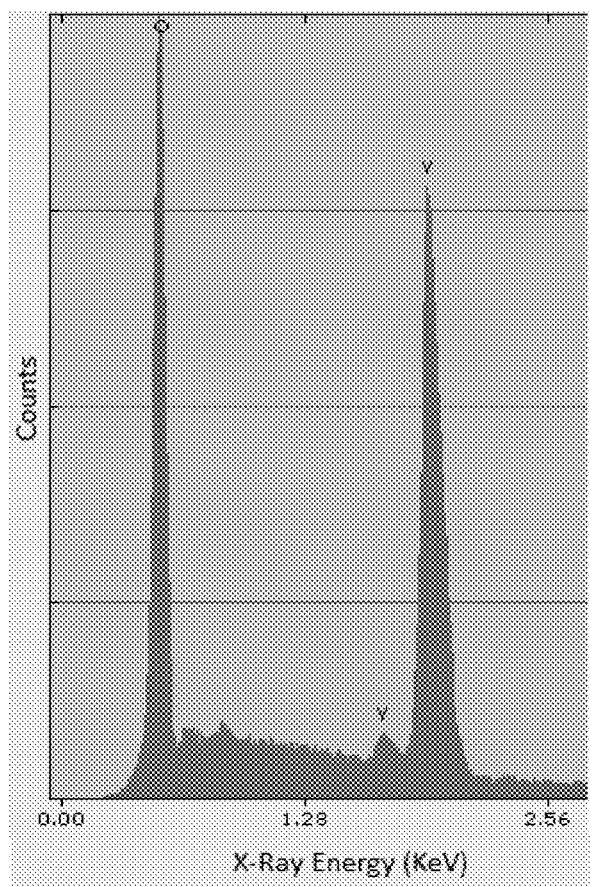
FIGS. 6A-6B are EDS analyses of (A) as-deposited yttria film, and (B) fluoro-annealed yttria film.
Figure 6B:
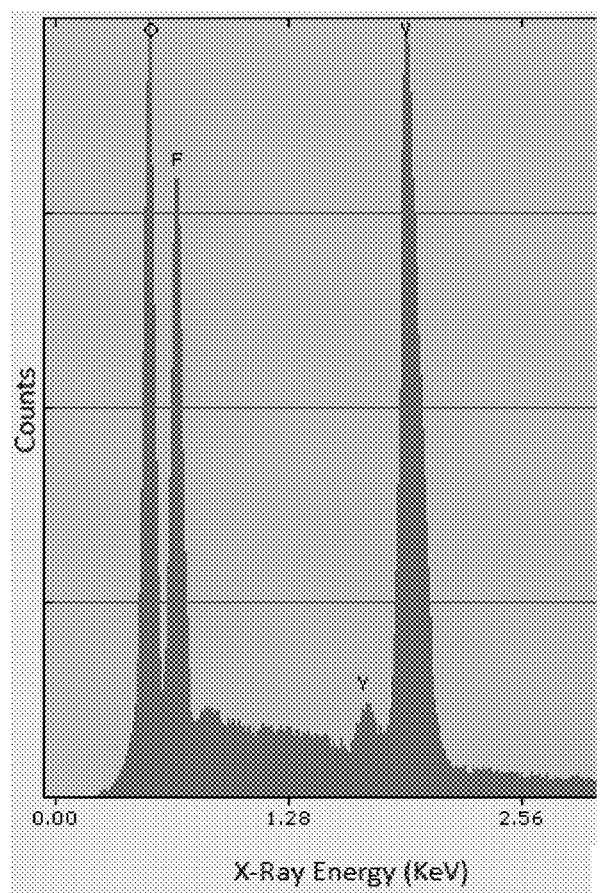

FIGS. 6A-6B show the EDS analyses of as-deposited yttria (FIG. 6A) and fluoro-annealed yttria (FIG. 6B) film samples. As shown in FIG. 6A there was no fluorine found in the as-deposited yttria. As shown in FIG. 6B, there was a significant amount of fluorine found in fluoro-annealed yttria film.

The measured amounts of yttrium (Y), oxygen (O), and fluorine (F) in two samples are shown in Table 1.

TABLE 1

Atomic percent of yttrium (Y), oxygen (O), and fluorine (F) measured in as-deposited and fluoro-annealed samples.

|  | As-deposited | Fluoro-annealed |
| --- | --- | --- |
| Y % | 26.5 | 23.02 |
| O % | 73.5 | 46.39 |
| F % | 0 | 30.59 |

The atomic percent of fluorine at the surface of film can be about 4% to about 40% in Yttria coatings after fluoro-annealing with different process parameters. The yttrium content varied between about 23% and 38% and the oxygen content between about 59% and 69.5% after fluoro-annealing.

Figure 7A:
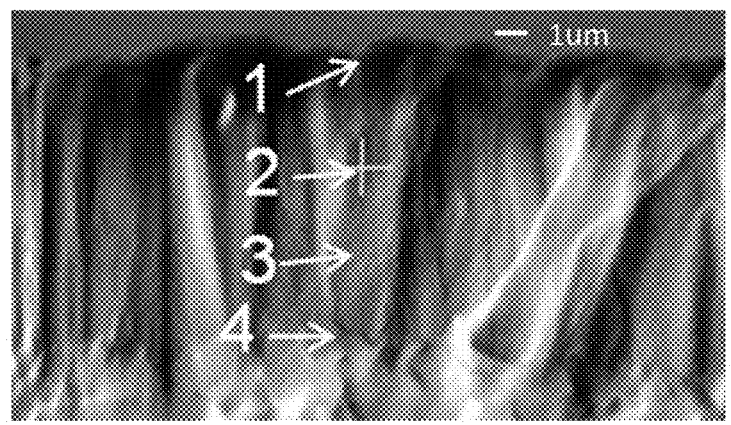
FIGS. 7A-7E include (A) a scanning electron photograph of a fluoro-annealed film with four locations marked, and (B-E) EDS analyses performed at the four locations.
Figure 7B:
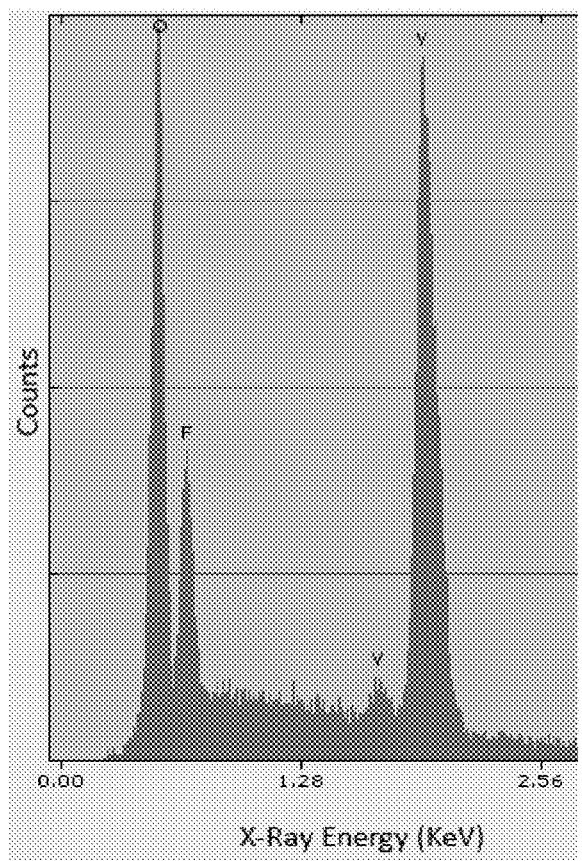
Figure 7C:
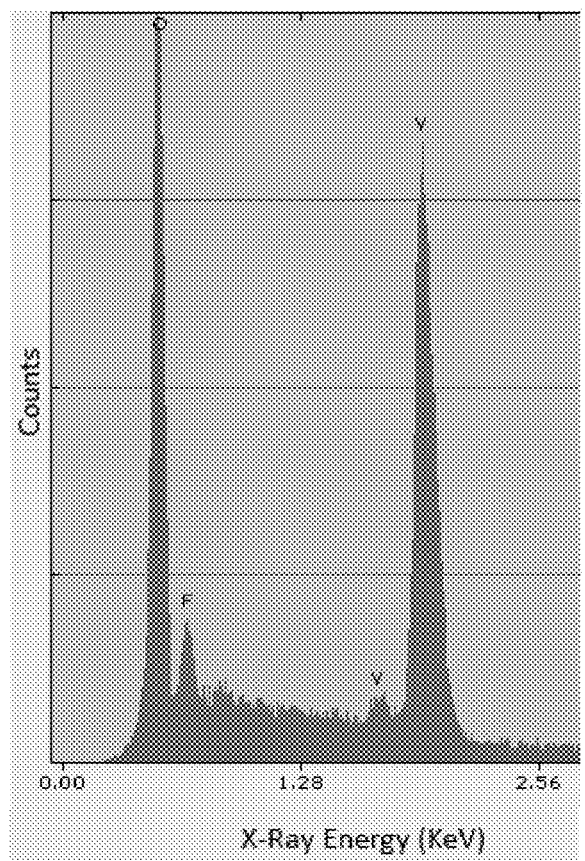
Figure 7D:
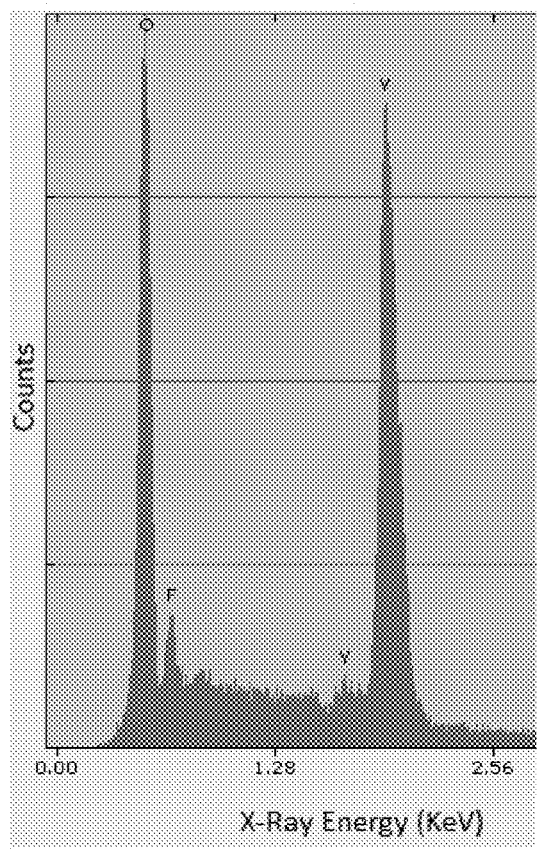
Figure 7E:
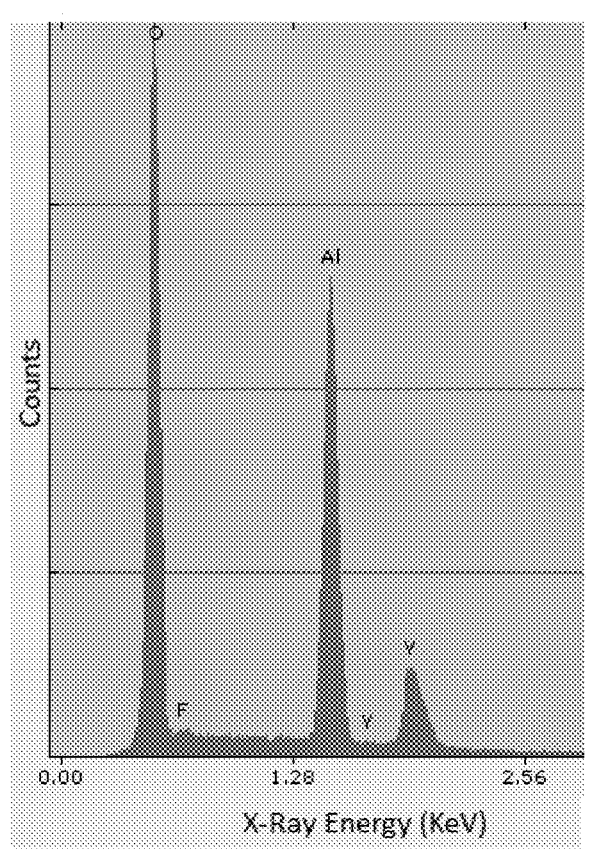

As shown in FIGS. 7A-7E, the atomic percentage of fluorine decreased over the depth of a fluoro-annealed film. FIG. 7A shows a side view of a fluoro-annealed yttria film with four locations marked, from location 1 at the top of the film (the top of the film being the side that is exposed to the environment) to location 4 at the bottom of the film (the bottom of the film being the side that interfaces with the underlying alumina substrate). The corresponding EDS analysis of the sample at each location are shown in FIG. 7B (location 1), FIG. 7C (location 2), FIG. 7D (location 3), and FIG. 7E (location 4). Note that the depth of location 1 is at approximately 1 micron from the top of the film, location 2 at approximately 3 microns from the top, location 3 at approximately 7 microns from the top, and location 4 at approximately 9 microns from the top.

The measured amounts of yttrium, oxygen, fluorine, and aluminum at the four locations are shown in Table 2.

TABLE 2

Atomic percent of oxygen (O), fluorine (F), yttrium (Y), and aluminum (Al) measured at four locations of a fluoro-annealed Yttria film.

|  | O % | F % | Y % | Al % |
| --- | --- | --- | --- | --- |
| Location 1 (top) | 58.73 | 16.7 | 24.93 | 0 |
| Location 2 | 69.17 | 6.12 | 24.71 | 0 |
| Location 3 | 67.76 | 5.35 | 26.89 | 0 |
| Location 4 (interface) | 58.85 | 0.05 | 4.29 | 36.8 |

Two samples with differing amounts of fluorine were created by annealing each sample with a fluorine source at a varying concentration. The compositions of the two samples are shown in Table 3.

TABLE 3

Atomic percent of oxygen (O), fluorine (F), and yttrium (Y) measured in samples created with a 1x F source and a 6x F source.

|  | Annealing with 1x F source | | | Annealing with 6x F source | | |
| --- | --- | --- | --- | --- | --- | --- |
|  | O | F | Y | O | F | Y |
| At. % | 66.01 | 9.54 | 24.45 | 46.09 | 33.52 | 20.39 |

The fluorine amount and depth was found to be controllable by manipulating process parameters, such as fluorine source amount, annealing time and annealing temperature.

EXAMPLE 8

Fluorine Stability

Figure 8A:
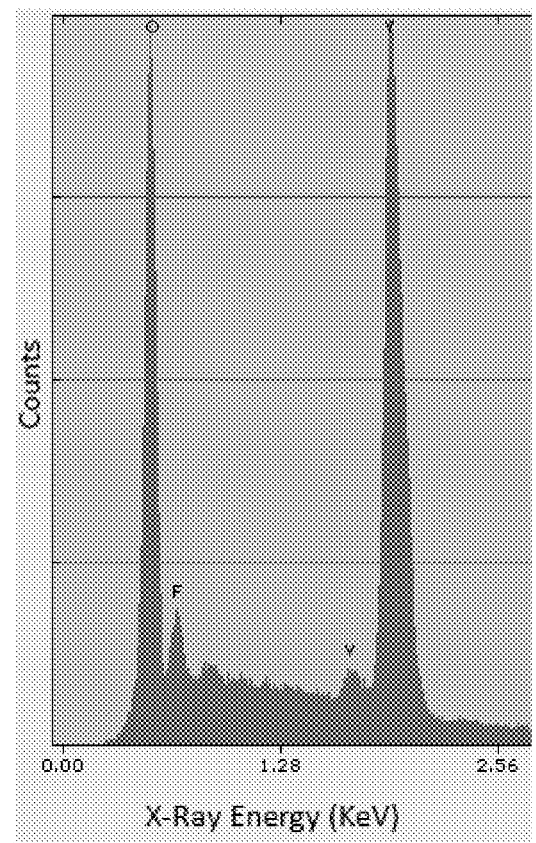
Figure 8B:
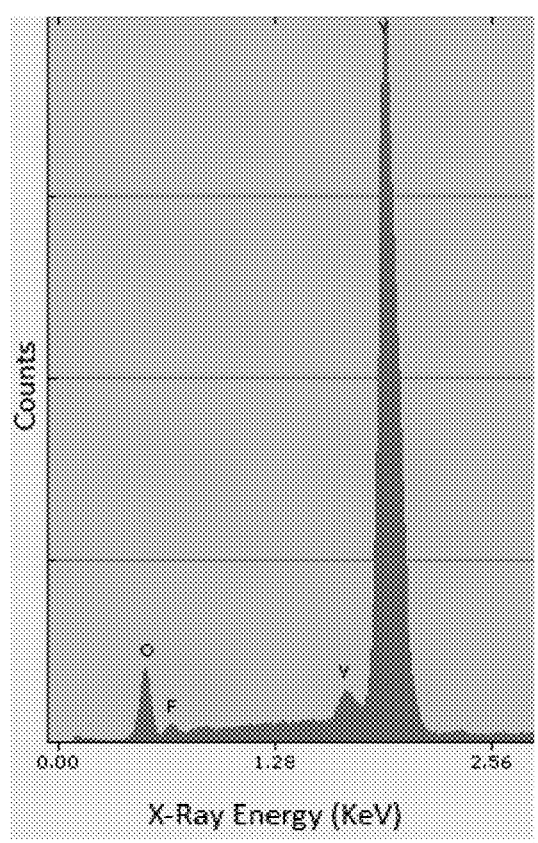

Fluoro-annealed yttria was baked at 150° C. in a high vacuum (E-6 torr) oven for 5 hours. After baking, the fluorine was still in the coating and the atomic percentage of fluorine did not decrease as determined by EDS. FIGS. 8A and 8B show the EDS analyses of two fluoro-annealed yttria samples prior to baking FIGS. 8C and 8D show the EDS analysis of the same two samples after baking As may be seen in a comparison of FIG. 8A with FIG. 8C and FIG. 8B with FIG. 8D, the relative amounts of fluorine remained consistent in both samples.

EXAMPLE 9

Wet Etch Resistance

Yttria samples were immersed in a 5% aqueous HCl solution for 5 minutes. As deposited yttria survived in 5% aqueous HCl for about 2 minutes. Fluoro-annealed yttria survived in 5% aqueous HCl for about 5 to about 120 minutes.

Fluoro-annealed yttria films which had higher fluorine content had better wet etch resistance than films having lower fluorine content. As shown in Table 4, fluorine films having higher amounts of fluorine at increased depths showed greater HCl resistance.

Note that the depth of location 1 is at approximately 1 micron from the top of the film, location 2 at approximately 3 microns from the top, location 3 at approximately 7 microns from the top, and location 4 at approximately 9 microns from the top.

TABLE 4

Atomic percent of fluorine (F) of Samples A-G at 4 locations versus HCl resistance.

|  |  | Sample A | Sample B | Sample C | Sample D | Sample E | Sample F | Sample G |
|---|---|---|---|---|---|---|---|---|
| Fluorine at. % | Loc 1 (top) | 31.25 | 33.18 | 30.86 | 32.06 | 31.38 | 32.14 | 34.33 |
|  | Loc 2 | 9.49 | 9.12 | 7 | 15.42 | 16.56 | 28.52 | 32.29 |
|  | Loc 3 | 5.82 | 8.93 | 6.97 | 9.92 | 13.66 | 24.9 | 31.24 |
|  | Loc 4 (interface) | 2.06 | 1.41 | 0.81 | 1.59 | 8.25 | 3.98 | 3 |
| 5% HCl Resistance (min) |  | 30 | 33 | 38 | 44 | 100 | 120 | 120 |

Increased fluorine content on the surface of the film also provided an increased HCl resistance. fluoro-annealed yttria with 30% fluorine at the surface survived in 5% HCl for about 30 minutes. Fluoro-annealed yttria with 8% fluorine at the surface survived in 5% HCl for about 15 minutes. Yttria without fluorine content survived less than about 2 minutes.

EXAMPLE 10

Dry Etch Resistance

Figure 9:
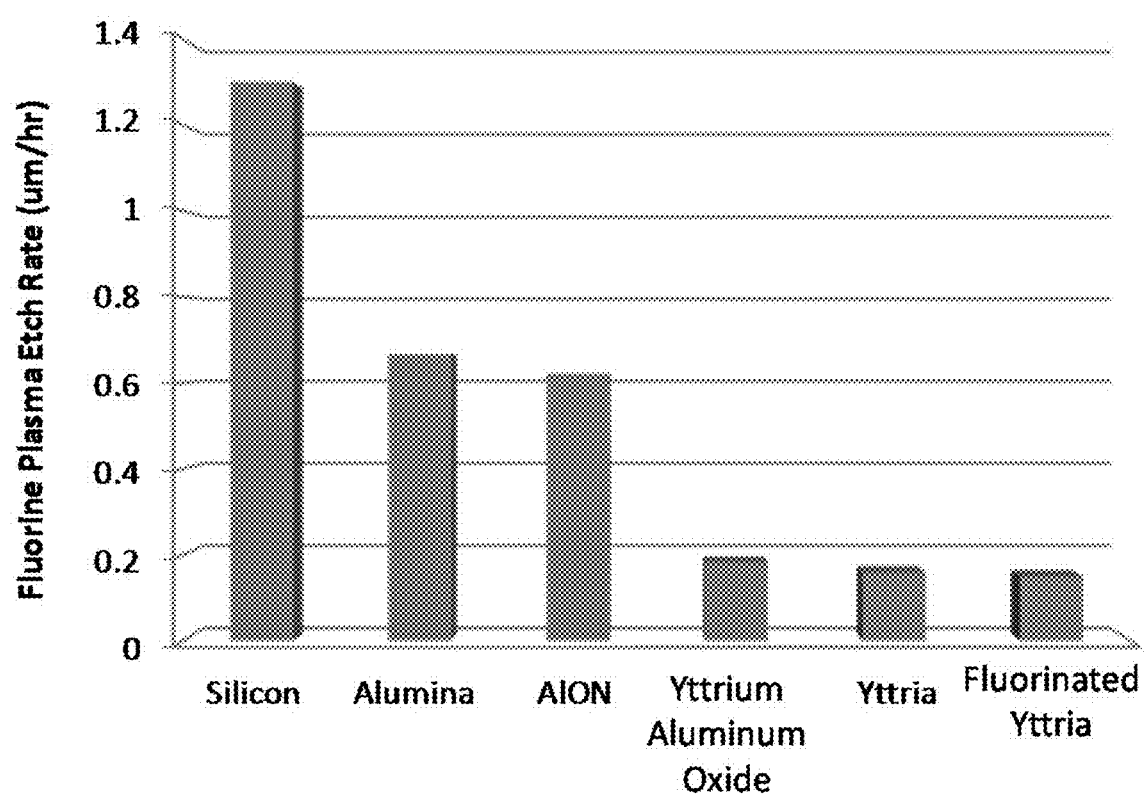
FIG. 9 is a graph of fluorine plasma etch rates of various etch resistance coatings.
Figure 10A:
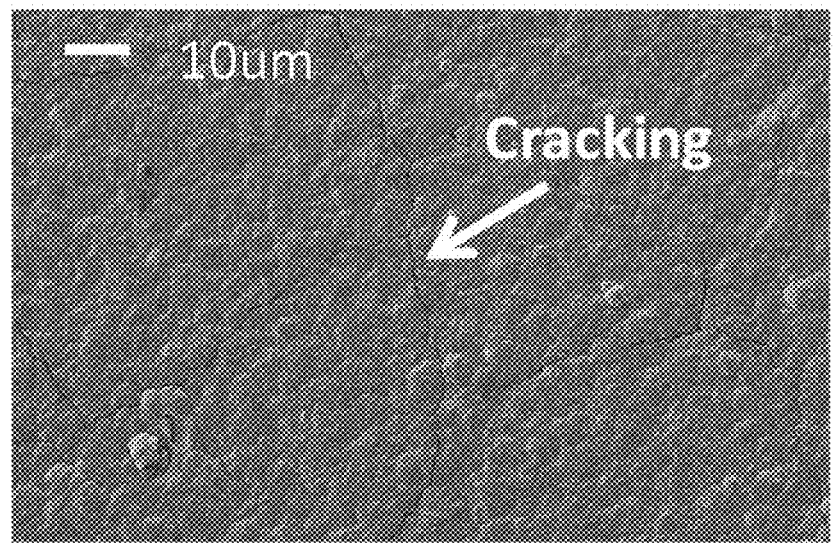
FIGS. 10A-10D are scanning electron photographs of a yttria coating on quartz after thermal cycle test.
Figure 10B:
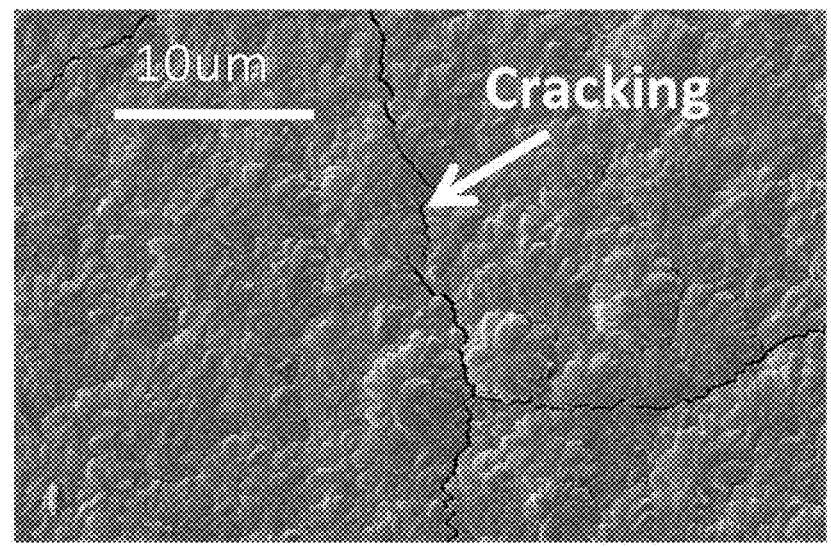
Figure 10C:
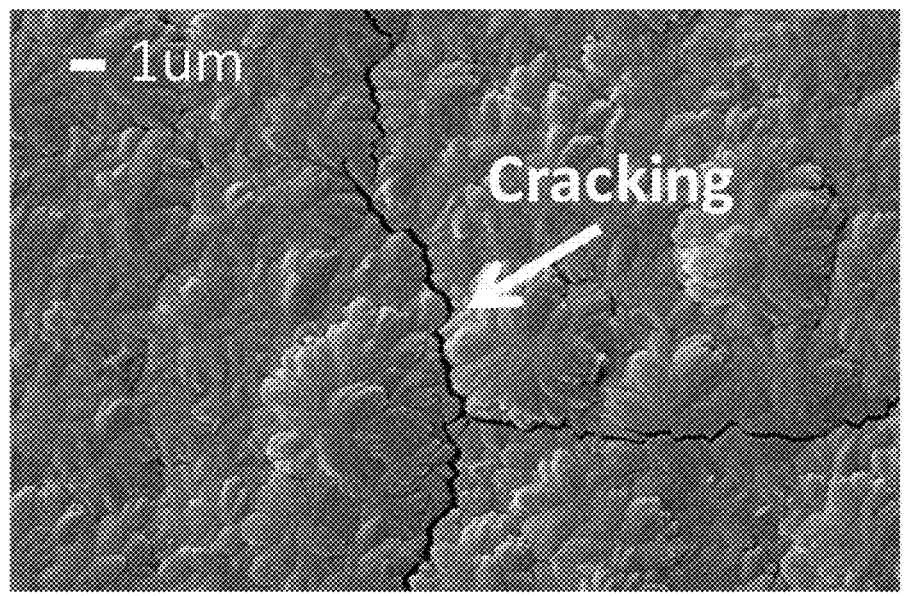
Figure 10D:
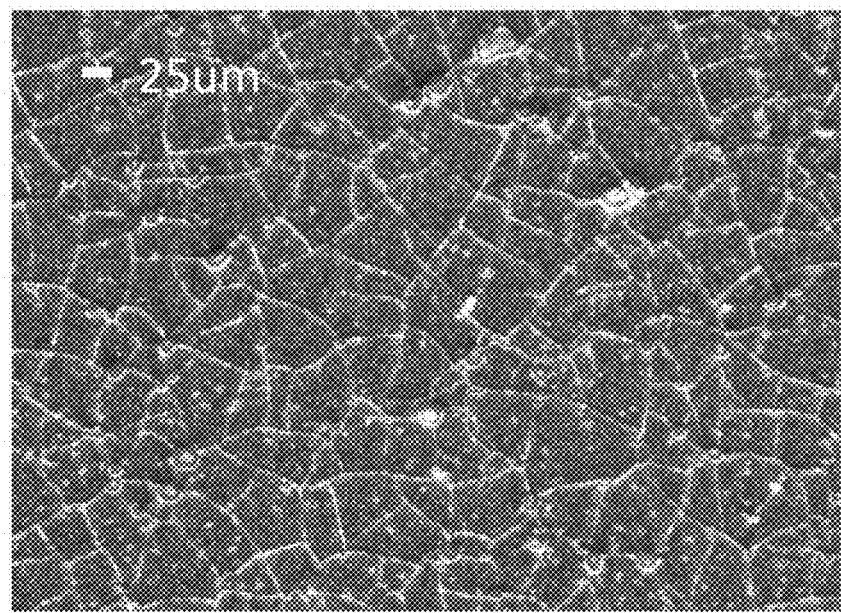

Silicon, alumina, aluminum oxynitride (AlON), yttrium aluminum oxide, as-deposited yttria and fluoro-annealed yttria samples were etched by an RIE tool with fluorine plasma. Both as-deposited and fluoro-annealed yttria provided good fluorine plasma resistance, as shown in FIG. 9, with etch rates of approximately 0.1 microns per hour.

EXAMPLE 11

Improved Delamination

Fluoro-annealed yttria films showed superior crack resistance and integrity at elevated temperatures (up to about 400° C.). In general, yttria is difficult to deposit on quartz substrates without cracking or delamination due to a large coefficient of thermal expansion (CTE) mismatch between yttria (CTE=$8 \times 10^{-6}$ $K^{-1}$) and quartz (CTE=$0.3 \times 10$ $K^{-1}$).

Figure 11A:
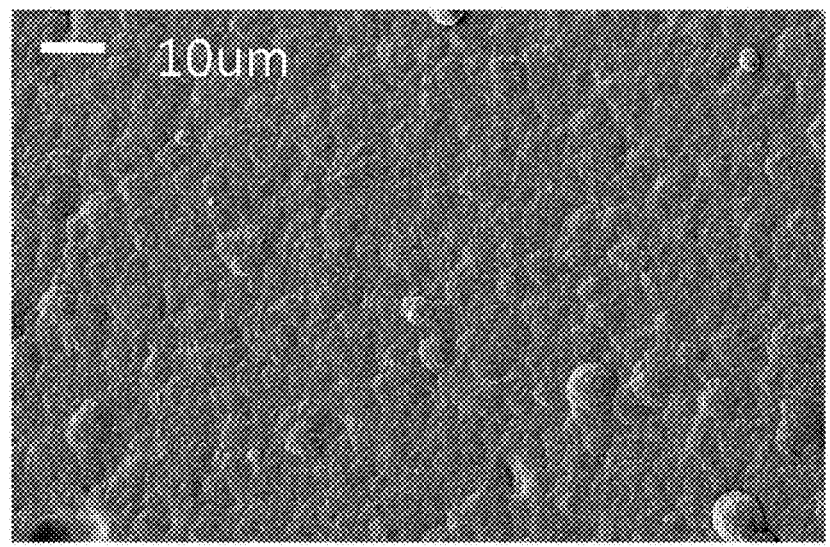
FIGS. 11A-11C are scanning electron photographs of a fluoro-annealed yttria coating on quartz.
Figure 11B:
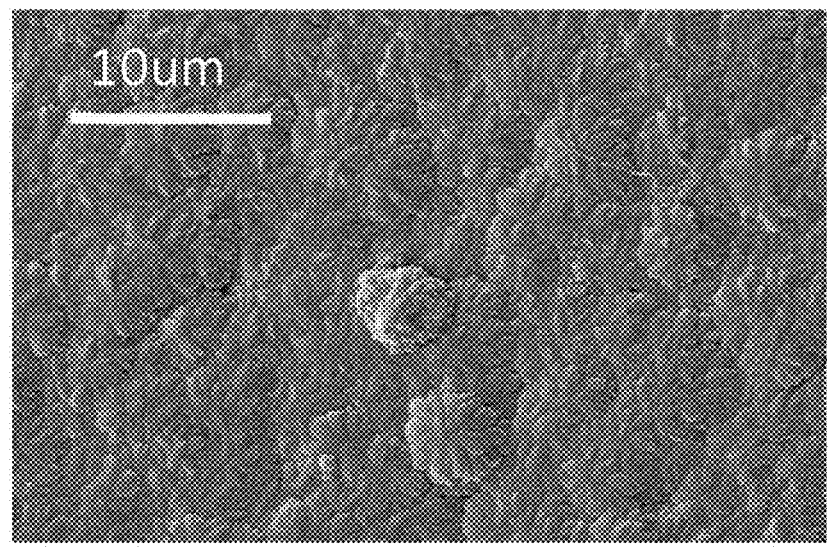
Figure 11C:
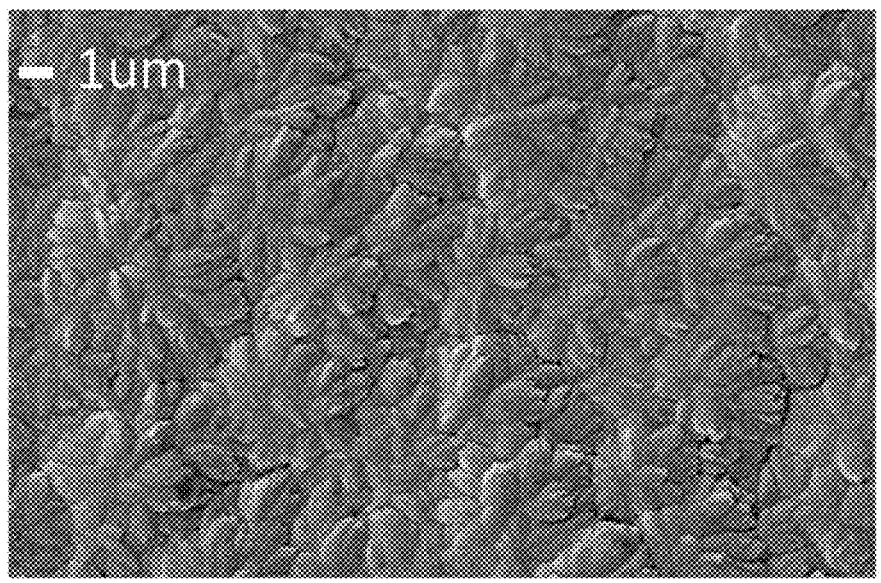
Figure 12A:
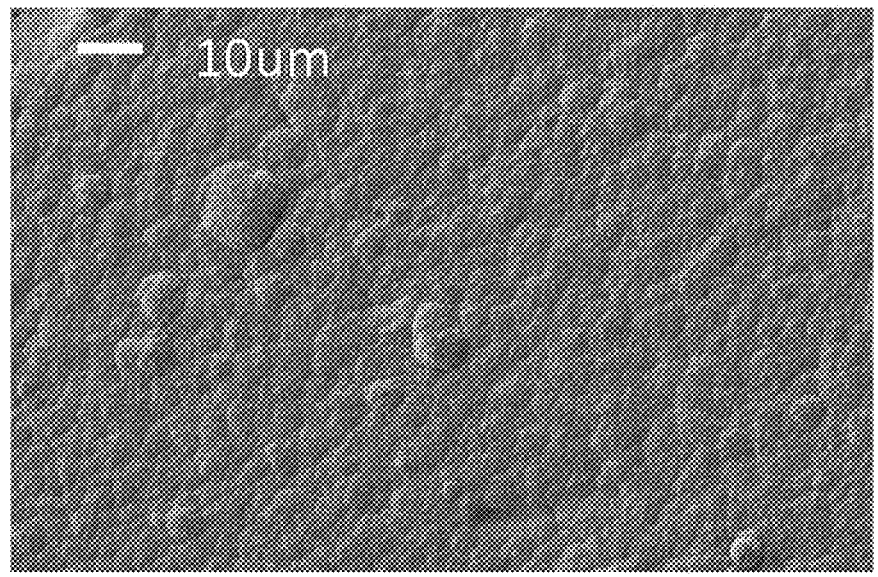
FIGS. 12A-12C are scanning electron photographs of a fluoro-annealed yttria coating on quartz after thermal cycle test.
Figure 12B:
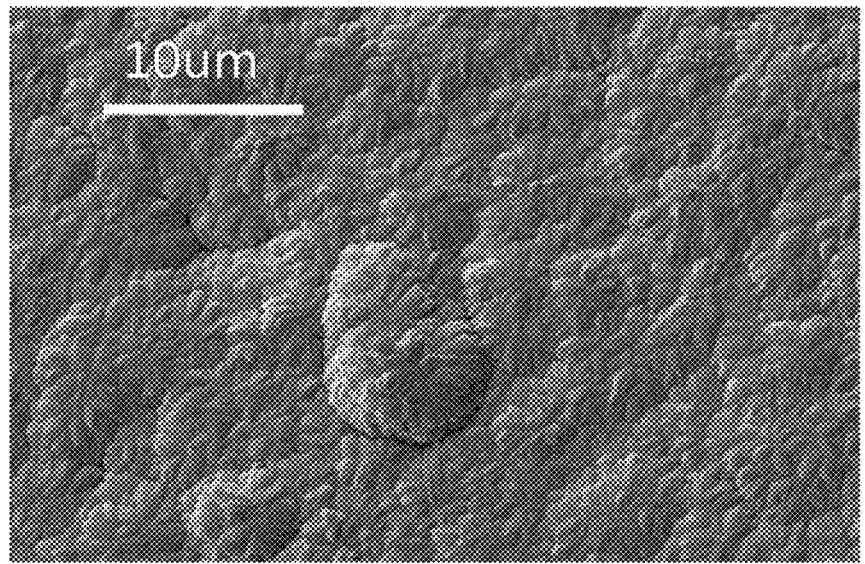
Figure 12C:
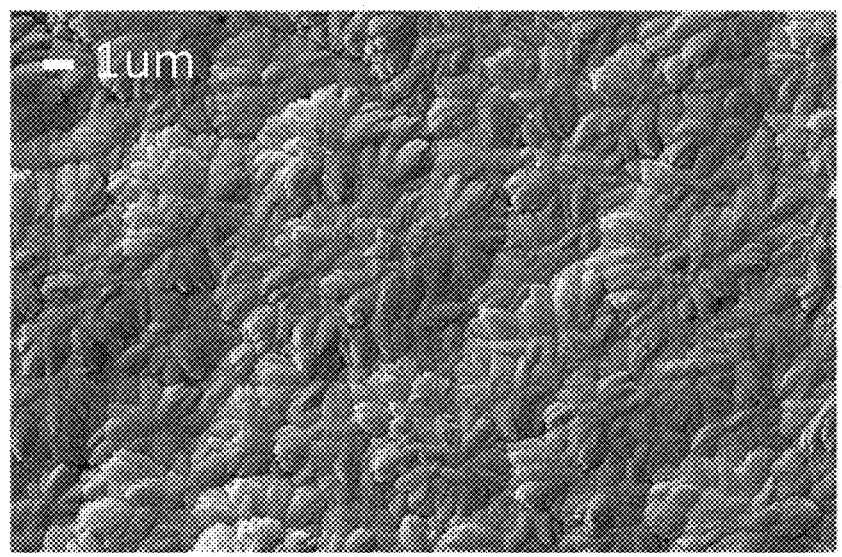

FIGS. 10A-10D show a yttria coating on a quartz substrate after annealing at 400° C. Cracks (indicated by arrows) are visible. FIGS. 11A-11C show a fluoro-annealed yttria coating on a quartz substrate after annealing at 400° C., without cracking FIGS. 12A-12C show a fluoro-annealed yttria coating on a quartz substrate after 3 cycles of 300° C. annealing, without cracking

EXAMPLE 12

Fluorination of Various Materials

Fluoro-annealing at 400° C. for 1 hour was performed with respect to various coatings to determine whether they could be fluorinated.

The coatings (applied by PVD sputtering) included alumina ($Al_rO_s$), ceria ($Ce_mO_n$), yttrium aluminum oxide ($Y_eAl_fO_g$), aluminum oxynitride ($Al_iO_jN_k$), and yttria ($Y_xO_y$). A yttria coating applied by thermal spray was also tested.

Both thermal spray and PVD yttria were successfully fluorinated. The PVD yttrium aluminum oxide was also successfully fluorinated. The PVD alumina, ceria and aluminum oxynitride samples were not fluorinated by the fluoro-annealing process.

Without subscribing to a particular theory, it is suggested that, because $Y_oAl_pO_q$ is a mixture of yttria and alumina, fluorine can react with the yttria in $Y_oAl_pO_q$, enabling the successful fluorination of the film.

A summary of the results of the fluorination of various metal oxides is shown in Table 5. Note that the depth of location 1 is at approximately 1 micron from the top of the film, location 2 at approximately 3 microns from the top, location 3 at approximately 7 microns from the top, and location 4 at approximately 9 microns from the top.

TABLE 5

Atomic percent of fluorine at various locations following fluoro-annealing of alumina, ceria, aluminum oxynitride, Yttrium Aluminum Oxide, and Yttria by thermal spray deposition and PVD.

| F % | Alumina | Ceria | Aluminum Oxynitride | Yttrium Aluminum Oxide | Yttria (thermal spray) | Yttria (PVD) |
|---|---|---|---|---|---|---|
| Surface | 0 | 0 | 0 | 14 | 38 | 42 |
| Loc 1 | N/A | N/A | N/A | 11 | 37 | 42 |
| Loc 2 | N/A | N/A | N/A | 0 | 26 | 33 |
| Loc 3 | N/A | N/A | N/A | 4 | 10 | 15 |
| Loc 4 | N/A | N/A | N/A | 3 | 1 | 9 |

The teachings of all patents, published applications and references cited herein are incorporated by reference in their entirety.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that features and/or elements depicted herein are illustrated with particular dimensions and/or orientations relative to one another for purposes of simplicity and ease of understanding, and that the actual dimensions and/or orientations may differ substantially from that illustrated herein.

While this invention has been particularly shown and described with references to example embodiments thereof, it will be understood by those skilled in the art that various changes in form and details may be made therein without departing from the scope of the invention encompassed by the appended claims.

What is claimed is:

1. An article, comprising:
   a vacuum compatible substrate;
   a protective film overlying at least a portion of the substrate, the film comprising a fluorinated metal oxide containing yttrium wherein the film contains fluorine at a depth of at least 0.1 micron and is a graded film having a fluorine concentration that decreases over the depth of the film from an outer portion to an inner portion,
   wherein the film includes rhombohedral or tetragonal $Y_aO_bF_c$ where c/(a+b) 0.04~0.67 or $Y_eAl_fO_gF_h$, where h/(e+f+g)=0.05-0.54.

2. The article of claim 1, wherein the protective film is yttrium oxyfluoride or yttrium aluminum oxyfluoride.

3. The article of claim 1, wherein the film is a graded film, the fluorine content of the film decreasing over a thickness of the film from an outer portion that is yttrium oxyfluoride to an inner portion that is yttria.

4. The article of claim 1, wherein an outer portion of the film from about 1 micron to about 2 microns thick is yttrium oxyfluoride and a remaining portion of the film is yttria.

5. The article of claim 1, wherein the film is a graded film, the fluorine content of the film decreasing over a thickness of the film from an outer portion that is yttrium aluminum oxyfluoride to an inner portion that is yttrium aluminum oxide.

6. The article of claim 1, wherein the film includes yttrium aluminum oxide ($Y_oAl_pO_q$), where o/(p+q)=0.03~0.18, can convert to yttrium aluminum oxyfluoride ($Y_eAl_fO_gF_h$), where h/(e+f+g)=0.05~0.54.

7. The article of claim 6, wherein an outer portion of the film from about 1 micron to about 2 microns thick is yttrium aluminum oxyfluoride and a remaining portion of the film is yttrium aluminum oxide.

8. The article of claim 1, wherein the film is about 1 micron to about 15 microns thick.

9. The article of claim 1, wherein the film adheres to the substrate after 5 or more minutes in contact with or submerged in 5% aqueous hydrochloric acid at room temperature.

10. The article of claim 1, wherein the vacuum compatible substrate is quartz, alumina, aluminum, steel, metal, metal alloy, ceramic, polyether ether ketone, or polyamide.

11. The article of claim 1, wherein the substrate is a component in a semiconductor manufacturing system.

12. The article of claim 11, wherein the vacuum compatible substrate is a chamber, chamber component, wafer susceptor, chuck, showerhead, liner, ring, nozzle, baffle, fastener, or wafer transport component.

13. The article of claim 1 wherein the film contains fluorine at a depth of at least 1 micron.

14. The article of claim 1, wherein the protective film contains yttrium, oxygen and fluorine, the film having:
   a yttrium content of between 23 atomic percent and 38 atomic percent determined by EDS;
   a fluorine content of between 4 atomic percent and 40 atomic percent;
   an oxygen content of between 59 atomic percent and 69.5 atomic percent.

15. The article of claim 8, wherein the film is at least 3 microns thick.

16. The article of claim 3, wherein the yttria has a cubic crystal structure.

* * * * *